April 21, 1970 P. A. CONGDON 3,508,109

DEFLECTION AMPLIFIER

Filed Jan. 27, 1969

INVENTOR
PHILIP A. CONGDON

BY Irving S. Rappaport
ATTORNEY

3,508,109
DEFLECTION AMPLIFIER

Philip A. Congdon, Marlboro, Mass., assignor to Raytheon Company, Lexington, Mass., a corporation of Delaware

Filed Jan. 27, 1969, Ser. No. 794,192
Int. Cl. H01j *29/76*
U.S. Cl. 315—27 7 Claims

ABSTRACT OF THE DISCLOSURE

An amplifier which is primarily a switching amplifier employing a very fast switch in the configuration of a non-linear, forward path with linear, passive feedback around the path used in driving a magnetic deflection yoke. In operation, no active circuit element delivering power to the load operates in a linear mode but rather all the devices delivering power to the load function as switches and dissipate an accordingly small amount of power themselves while delivering maximum available power to the load.

BACKGROUND OF THE INVENTION

Normally, a magnetic deflection yoke is driven by an analog deflection amplifier which typically is very inefficient. Such prior art analog deflection amplifiers lack high reliability, dissipate relatively high power, suffer from high acoustical noise due to the cooling provisions which usually exist, are relatively large in size and high in cost. The amplifier of the present invention is so constructed that no active circuit element delivering power to the load operates in a linear mode. Rather all the devices of the power amplifier function as switches and dissipate a small amount of power while delivering maximum power to the load. The switching amplifier configuration of the present invention includes a non-linear, forward path with linear, passive feedback around the path. It is essential that the switch or modulating device used in the circuit operate at frequencies greater than any of the frequency components being amplified. The existence of very fast switches on the order of less than a few nanoseconds has permitted the bandwidth of the switching amplifier of the present invention to be sufficiently extended so that the amplifier may be used as a deflection amplifier. At the same time, the amplifier does not limit the bandwidth of the deflection system which is primarily limited by the time constant limitation of the deflection coil and the series resistance as in present analog deflection systems.

The present invention, therefore, uses a switching amplifier to drive a magnetic deflection yoke. The circuit uses a non-linear type signal to drive the yoke, which approach provides the following advantages over the prior art: (1) An increased efficiency in terms of the reduction of power dissipation by a factor of almost 10 to 1; (2) An overall weight reduction of almost 40 to 1; (3) A size reduction on the order of 100 to 1; and (4) A cost reduction in production quantities of around 10 to 1. The amplifier of the present invention could be used in commercial television, commercial radar displays and virtually any type of cathode ray tube display device.

SUMMARY OF THE INVENTION

The above objects and advantages of the present invention, as well as others, are accomplished by providing a magnetic deflection amplifier comprising a switching amplifier including, a very fast switching means connected to an input signal, said switching means forming a non-linear, forward path, a linear, passive feedback path around said switching means, and output means connected between the amplifier and a magnetic deflection yoke for applying an output signal from the amplifier to drive the yoke.

DESCRIPTION OF THE PREFERRED EMBODIMENTS

Figure 1:
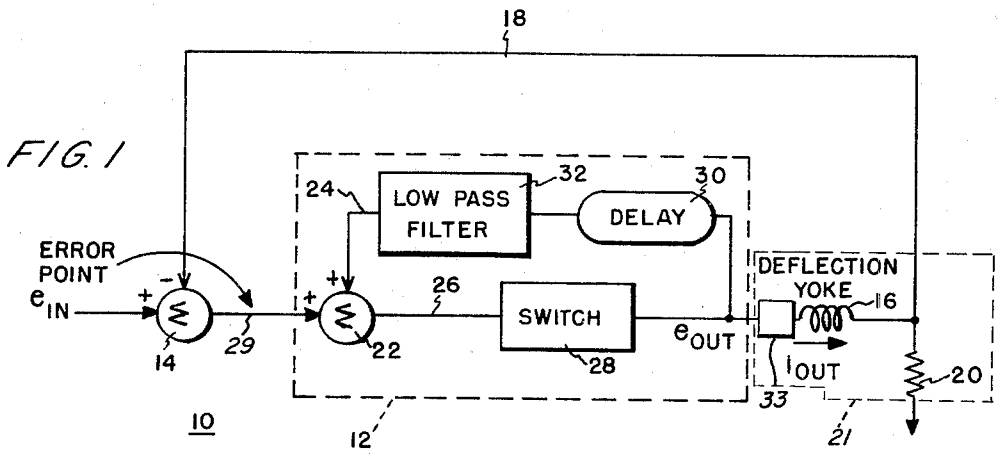
FIG. 1 is a block diagram showing the amplifier of the present invention.
Figure 2A:
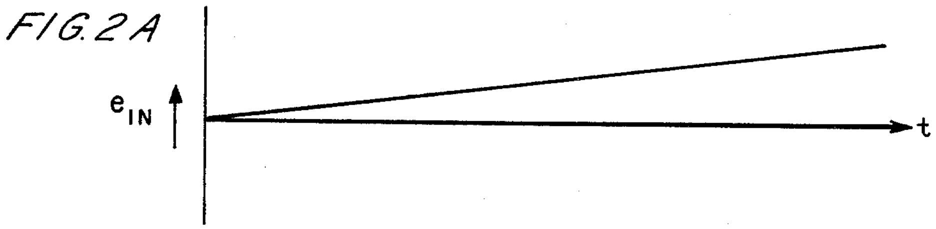
FIGS. 2A, B and C show the input and output waveforms of the amplifier shown in FIG. 1.
Figure 2B:
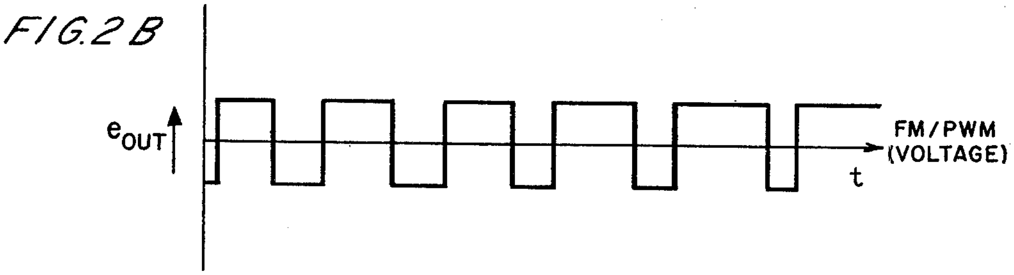
Figure 2C:
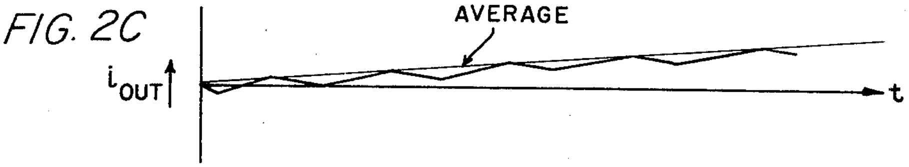

FIG. 1 shows a switching amplifier circuit 10 which is used in driving a magnetic deflection yoke. The circuit 10 includes a switching amplifier 12 shown in the dotted block 12 which is continually switching its output between two levels at some predetermined rate. This continuation exists for a zero level signal input to the circuit 10. As an input signal, $e_{in}$, is applied to a summing circuit 14, it is compared with a portion of the output signal from a current sensing device 20 which is fed back around a loop 18 to the summing circuit 14. The output of the summing circuit 14 is referred to as the error point. The switching rate of the amplifier 12 will be varied as a function of the signal at the error point which, in turn, will cause the output to be modified. The net effect of the operation of the circuit 10 is that as the input analog signal, $e_{in}$, is changed, the frequency rate and pulse width of the output signal, $e_{out}$, is varied. FIG. 2A shows input signal, $e_{in}$, and also the current through the deflection yoke 16, $i_{out}$. FIG. 2B shows the switch waveform, $e_{out}$, which appears at the output of the switching amplifier 12. This output, $e_{out}$, is then averaged or varied by a filter 21 which contains the deflection yoke 16, the current sensing device 20, and a low pass filter 33, as part of the filter. As a result, the desired current waveform, $i_{out}$ (FIG. 2C), is obtained in the deflection yoke 16. As seen in FIG. 2B, the output of the switching amplifier, $e_{out}$, is almost always at one of two levels except for the switching intervals.

The switching amplifier 12 shown in the dotted block is a switching amplifier whose output is positively fed back within the switching amplifier to cause it to oscillate at a predetermined rate. The output from the summing circuit 14, which is the difference or error between the input voltage, $e_{in}$, and the voltage on line 18 proportional to the output or yoke current ($i_{out}$), as measured across the sensing device 20, is the input at point 29, to the switching amplifier 12. Interval to the switching amplifier 12, the output voltage, $e_{out}$, of the switch 28 is fed back to the input with a positive sense through a delay network 30 and a low pass filter 32. This causes the switching amplifier to oscillate with no input at a frequency determined solely by the characteristic of the delay network 30, low pass filter 32 and switch 28. Upon application of the error signal at point 29 to the switching amplifier, the signal observed at the output of the switching amplifier 12 is observed to be both pulse width and frequency modulated as a function of the magnitude and polarity of the input voltage, $e_{in}$.

In order for the switching amplifier circuit 10 of the present invention to operate at the required frequencies from .1 to 10 megacycles and higher, the switch 28 must be rapid enough to accommodate these frequency rates. One type of switch which may be used as the switch 28 in order to use the switching amplifier 12 of the present invention to drive the magnetic deflection yoke 16 is described in Patent No. 3,271,591 entitled, "Symmetrical Current Controlling Device." The switch described in that patent is referred to as an Ovonic switch and is capable of switching at rates of less than 2 nanoseconds. In addition to this type of switch, the switch 28 may be of any other configuration which is capable of switching at the required rates. Such solid-state circuits are presently known and available in the switching field. The delay element 30 is a time delay which could be in the form of a lumped constant delay line or other conventional type of time delay element. The low pass filters 32 and 33 may be any type of conventional low pass filters.

Employment of the switching amplifier circuit 10 shown in FIG. 1 to drive a magnetic deflection yoke results in a great reduction in power dissipation, reduction in both weight and size of the required circuit and a great reduction in costs. This type of switching amplifier could be employed in commercial television, commercial radar displays and generally any type of cathode ray tube devices.

It should be understood, of course, that the foregoing disclosure relates to only a preferred embodiment of the invention and that numerous modifications or alterations may be made therein without departing from the spirit and the scope of the invention as set forth in the appended claims.

I claim:

1. A magnetic deflection amplifier comprising:
a switching amplifier including,
switching means capable of switching in no more than a few microseconds and connected to an input signal, said switching means forming a non-linear, forward path,
a linear, passive feedback path around said switching means, and
output means connected between the amplifier and a magnetic deflection yoke for applying an output signal from the amplifier to drive the yoke.

2. An amplifier in accordance with claim 1 wherein: said switching means is an Ovonic switch.

3. An amplifier in accordance with claim 1 wherein: said switching means comprises a switching circuit capable of switching in less than 2 nanoseconds.

4. An amplifier in accordance with claim 1 wherein: said feedback path includes a delay means connected in series with a low pass filter to permit oscillation of said amplifier which modifies the frequency and pulse width of the output of said amplifier.

5. A magnetic deflection amplifier for driving a magnetic deflection yoke, said amplifier comprising:
a switching amplifier including,
a switching circuit having an input signal applied thereto, said switching circuit forming a non-linear, forward path capable of switching the signal in less than 2 nanoseconds,
a linear, passive feedback path around said switching circuit, said path including a time delay element connected in series with a low pass filter to permit oscillation of said amplifier which modifies the frequency and pulse width of the output of said amplifier, and
output means connected between the amplifier and a magnetic deflection yoke for applying an output signal from the amplifier to drive the yoke.

6. A magnetic deflection amplifier for driving a magnetic deflection yoke, said amplifier comprising:
a switching amplifier including,
a switching circuit having an input signal applied thereto, said switching circuit forming a non-linear, forward path capable of switching the signal in less than 2 nanoseconds,
a linear, passive feedback path around said switch-circuit, said path including a time delay element connected in series with a low pass filter to permit oscillation of said amplifier which modifies the frequency and pulse width of the output of said amplifier, and
a summing circuit for summing a signal from the feedback path with the incoming input signal, the output of said summing circuit being applied to said switching circuit; and
output means connected between the amplifier and a magnetic deflection yoke for applying an output signal from the amplifier to drive the yoke.

7. An amplifier in accordance with claim 6 wherein: said switching circuit comprises an Ovonic switch.

References Cited

UNITED STATES PATENTS

| | | | |
|---|---|---|---|
| 2,604,608 | 7/1952 | Moore | 315—23 |
| 2,668,910 | 2/1954 | Starr | 328—178 |
| 2,961,536 | 10/1960 | Schuhlein | 328—67 |
| 2,996,641 | 8/1961 | Paynter. | |
| 3,275,847 | 9/1966 | Kitchin. | |

RODNEY D. BENNETT, Primary Examiner

J. G. BAXTER, Assistant Examiner

U.S. Cl. X.R.

315—18